United States Patent
Huang et al.

(10) Patent No.: US 7,616,039 B2
(45) Date of Patent: Nov. 10, 2009

(54) MEMORY RESET APPARATUS

(75) Inventors: Lan Huang, Shanghai (CN); Shih-Hao Liu, Taipei (TW)

(73) Assignee: Inventec Corporation, Taipei (TW)

( * ) Notice: Subject to any disclaimer, the term of this patent is extended or adjusted under 35 U.S.C. 154(b) by 145 days.

(21) Appl. No.: 11/970,962

(22) Filed: Jan. 8, 2008

(65) Prior Publication Data

US 2009/0115470 A1   May 7, 2009

(30) Foreign Application Priority Data

Nov. 2, 2007   (TW) .............................. 96141580 A

(51) Int. Cl.
*H03K 3/02* (2006.01)
*G06F 13/00* (2006.01)

(52) U.S. Cl. ............................ 327/198; 711/166; 713/1

(58) Field of Classification Search ................. 327/142, 327/143, 198; 711/166; 713/1
See application file for complete search history.

(56) References Cited

U.S. PATENT DOCUMENTS 6,147,542 A * 11/2000 Yaklin ......................... 327/344
6,172,936 B1 * 1/2001 Kitazaki ................... 365/233.17
2007/0005952 A1 * 1/2007 Ho ............................... 713/2

FOREIGN PATENT DOCUMENTS

TW          270818         1/2007

* cited by examiner

*Primary Examiner*—Lincoln Donovan
*Assistant Examiner*—Patrick O'Neill
(74) *Attorney, Agent, or Firm*—J.C. Patents

(57) ABSTRACT

A memory reset apparatus including a first inverse circuit, a logic circuit, and a plurality of second inverse circuits is provided. The first inverse circuit receives a control signal generated by a north bridge and generates a first signal, in which the control signal controls reset of a plurality of memories. The logic circuit performs a logic operation of the first signal and an indicating signal and generates a second signal, in which the indicating signal indicates each component of a computer system completely powered on. The plurality of second inverse circuits is respectively coupled between the logic circuit and the memories. The second inverse circuits inverse the second signal and respectively generate a plurality of reset signals to the memories, so as to reset the memories.

6 Claims, 2 Drawing Sheets

MEMORY RESET APPARATUS

CROSS-REFERENCE TO RELATED APPLICATION

This application claims the priority benefit of Taiwan application serial no. 96141580, filed on Nov. 2, 2007. The entirety of the above-mentioned patent application is hereby incorporated by reference herein and made a part of this specification.

BACKGROUND OF THE INVENTION

1. Field of the Invention

The present invention relates to a reset apparatus, and more particularly to a memory reset apparatus.

2. Description of Related Art

Generally, after a computer system is booted and each component in the computer system has been completely powered on, memories are required to be reset. FIGS. 1A and 1B are circuit diagrams of a conventional memory reset apparatus. Referring to FIG. 1A first, after a computer system is booted and each component in the computer system has been completely powered on, an indicating signal $S_{PGD}$ at a logical high voltage level is generated and transmitted to memories of different branches through a buffer 102, so as to ensure that the reset of the memories is performed after the computer system has been completely powered on.

Next, referring to FIG. 1B, a north bridge generates a reset signal $S_{RESET}$ at a logical high voltage level and generates a inverted reset signal $S_{RESET\_N}$ (at a logical low voltage level) to memories of different branches through a transistor T1. When the indicating signal $S_{PGD}$ received by the memory of each branch is at a logical "high" voltage level and the inverted reset signal $S_{RESET\_N}$ is at a logical "low" voltage level, the memories are reset. If the indicating signal $S_{PGD}$ and the inverted reset signal $S_{RESET\_N}$ are at logical low voltage levels, the memories will not be reset.

Although the memory reset apparatus can complete resetting of the memories during booting the computer system, the conventional memory reset apparatus uses many circuit components, such that the wires are more congested when fabricating the layout diagram of the printed circuit board (PCB) and the circuit cost is thus increased.

SUMMARY OF THE INVENTION

Accordingly, the present invention is directed to provide a memory reset apparatus, capable of effectively reducing the components used in the circuit design, so as to save the layout space and reduce the cost of the circuit.

The present invention provides a memory reset apparatus including a first inverse circuit, a logic circuit, and a plurality of second inverse circuits. An input end of the first inverse circuit receives a control signal generated by a north bridge and inverses the control signal to generate a first signal at an output end. The control signal controls reset of a plurality of memories. The logic circuit has a first input end, a second input end, and an output end. The first input end and the second input end of the logic circuit respectively receive the first signal and an indicating signal, so as to perform a logical operation of the first signal and the indicating signal, and generate a second signal at the output end of the logic circuit. The indicating signal indicates each component of the computer system completely powered on.

Accordingly, a plurality of second inverse circuits is respectively coupled between the logic circuit and the plurality of memories. Input ends of the second inverse circuits receive the second signal and inverse the second signal, so as to respectively generate a plurality of reset signals to the memories at output ends thereof, thereby resetting the memories.

In an embodiment of the present invention, the logic circuit includes a NAND gate. The NAND gate has a first input end, a second input end, and an output end. The first input end of the NAND gate receives the first signal, the second input end of the NAND gate receives the control signal, and the output end of the NAND gate generates the second signal.

In an embodiment of the present invention, the first inverse circuit includes a first resistor, a second resistor, a first transistor, a third resistor, and a capacitor. The first resistor has a first end coupled to a first voltage and a second end coupled to the indicating signal. The second resistor has a first end coupled to the second end of the first resistor. The first transistor has a base end coupled to a second end of the second resistor and an emitter end coupled to a ground end. The third resistor has a first end coupled to the first voltage and a second end coupled to a collector end of the first transistor. The capacitor has a first end coupled to a first end of the third resistor and a second end coupled to the ground end. The first transistor is a NPN bipolar transistor.

In an embodiment of the present invention, the second inverse circuits include a fourth resistor and a second transistor. The fourth resistor has a first end coupled to the output end of the NAND gate. The second transistor has a base end coupled to a second end of the fourth resistor, an emitter end coupled to the ground end, and a collector end for generating the reset signal. The second transistor is a NPN bipolar transistor.

The present invention can achieve the function of resetting the memories by the first inverse circuit, the logic circuit, and the second inverse circuits after the computer system is booted. Therefore, the present invention can complete resetting of the memories by using fewer components, thus saving the layout space and reducing the cost of the circuit.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
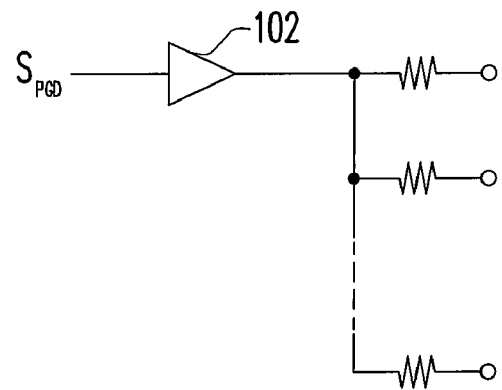
FIGS. 1A and 1B are circuit diagrams of a conventional memory reset apparatus.
Figure 1B:
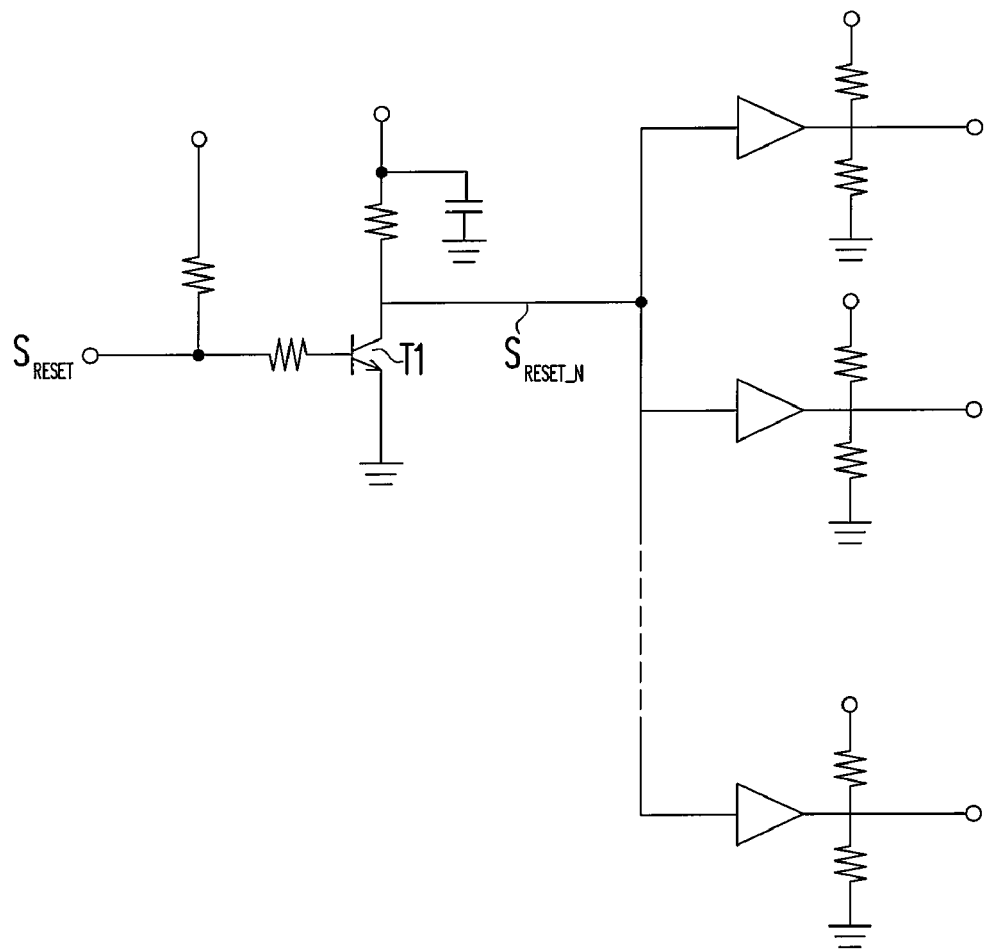
Figure 2:
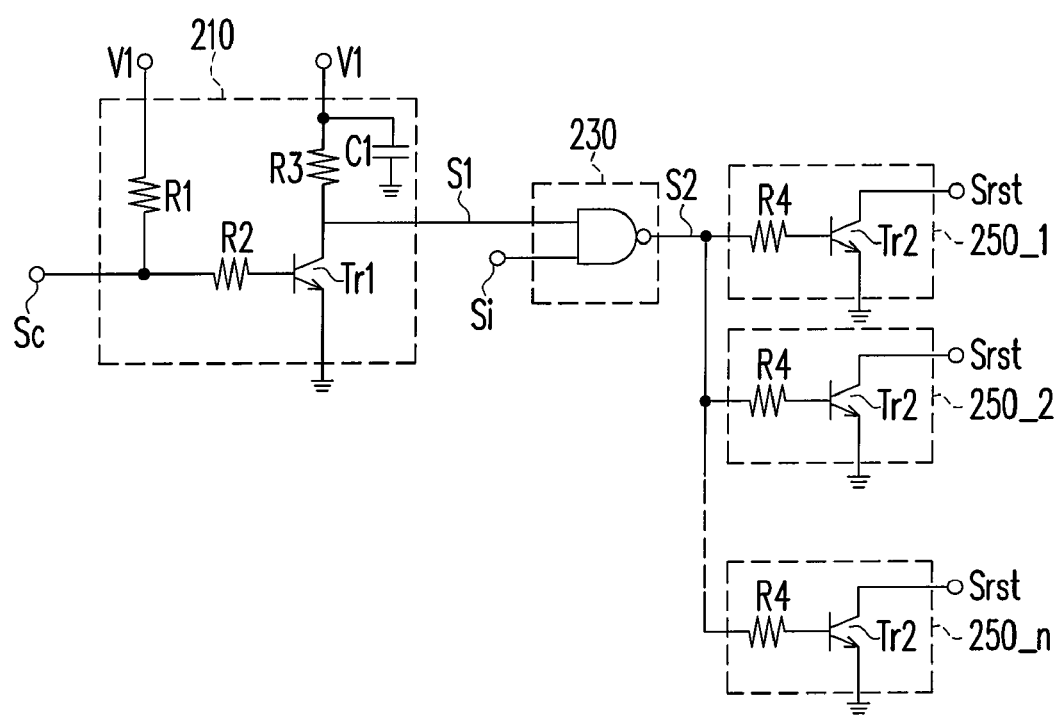
FIG. 2 is a circuit diagram of a memory reset apparatus according to an embodiment of the present invention.

FIG. 2 is a circuit diagram of a memory reset apparatus according to an embodiment of the present invention. Referring to FIG. 2, a memory reset apparatus 200 includes a first inverse circuit 210, a logic circuit 230, and second inverse circuits 250_1-250_n, in which n is a positive integer greater than 0.

An input end of the first inverse circuit 210 receives a control signal Sc generated by a north bridge (not shown) and generates a first signal S1 at an output end after inversing the control signal Sc. The control signal Sc can be a signal for controlling reset of a plurality of memories (not shown).

The logic circuit 230 has a first input end, a second input end, and an output end. The first input end and the second input end of the logic circuit 230 respectively receive the first signal S1 and an indicating signal Si. Next, the logic circuit 230 performs a logical operation of the first signal S1 and the indicating signal Si and generates a second signal S2 at the output end of the logic circuit 230. The indicating signal Si can be a signal for indicating each component of the computer system (not shown) completely powered on.

The second inverse circuits 250_1-250_n are respectively coupled between the logic circuit 230 and the memories. Input ends of the second inverse circuits 250_1-250_n respectively receive the second signal S2 and then inverse the second signal S2, so as to respectively generate a plurality of reset signals Srst to the memories at the output ends of the second inverse circuits 250_1-250_n, thereby resetting the memories. In this embodiment, the number of the second inverse circuits is corresponding to the umber of the memories. Accordingly, a user can adjust the number of the second inverse circuits as desired.

Referring to FIG. 2 again, the first inverse circuit 210 includes resistors R1-R3, a transistor Tr1, and a capacitor C1. A first end of the resistor R1 is coupled to a first voltage V1, and a second end receives the indicating signal Si. The resistor R2 has a first end coupled to the second end of the resistor R1. The transistor Tr1 has a base end coupled to a second end of the resistor R2, and an emitter end coupled to a ground end GND. The resistor R3 has a first end coupled to the first voltage V1 and a second end coupled to a collector end of the transistor Tr1. The capacitor C1 has a first end coupled to the first end of the resistor R3 and a second end coupled to the ground end GND.

The logic circuit 230 includes a NAND gate 231 having a first input end, a second input end, and an output end. The first input end of the NAND gate 231 receives the first signal S1, the second input end of the NAND gate 231 receives the control signal Sc, and the output end of the NAND gate 231 generates the second signal S2. The second inverse circuits 250_1-250_n each include a resistor R4 and a transistor Tr2. The resistor R4 has a first end coupled to the output end of the NAND gate 231. The transistor Tr2 has a base end coupled to a second end of the resistor R4, an emitter end coupled to the ground end GND, and a collector end for generating the reset signal Srst. In this embodiment, the transistors Tr1, Tr2 are, for example, NPN bipolar transistors.

Each component in the memory reset apparatus 200 and the arrangement relationship have been illustrated. The operating process of the memory reset apparatus 200 is further illustrated below.

First, after the computer system is booted and each component in the computer system has been completely powered on, the indicating signal Si at a logical high voltage level is sent out and transmitted to the NAND gate 231 by the computer system. In the other aspect, as the computer system has just been booted, the control signal Sc is at a logical low voltage level, and the transistor Tr1 is not turned on, such that the voltage level of the first signal S1 is the first voltage V1 (i.e., a logical high voltage level), and the first signal S1 is transmitted to the NAND gate 231.

At this time, the first signal S1 and the indicating signal Si received by the NAND gate 231 are at high voltage level, such that the second signal S2 generated by the NAND gate 231 is at a logical low voltage level and is transmitted to the transistor Tr2 through the resistor R4. As the second signal S2 is at a logical low voltage level, the transistor Tr2 is not turned on and cannot reset the memories.

Thereafter, after the north bridge is completely powered on, the control signal Sc is converted to be at a logical high voltage level (which indicates that it is necessary to reset the memories), such that the transistor Tr1 is turned on. As the transistor Tr1 is turned on, the first voltage V1 is coupled to the ground end GND through the resistor R3, such that the first signal S1 is at a logical low voltage level.

Next, when the first signal S1 received by the first input end of the NAND gate 231 is at a logical low voltage level, and the indicating signal Si received by the second input end of the NAND gate 231 is at a logical high voltage level, the second signal S2 generated by the output end of the NAND gate 231 will be converted to be at a logical high voltage level and be transmitted to the transistor Tr2 through the resistor R4, such that the transistor Tr2 is turned on. As the transistor Tr2 is turned on, the reset signal Srst is at a logical low voltage level, so as to reset the memories. Accordingly, reset of the memories can also be performed after each component in the computer system has been completely powered on. Compared with the conventional memory reset apparatus, the memory reset apparatus 200 of this embodiment uses less circuit components, and thus this embodiment can save the layout space and reduce the cost of the circuit.

In view of the above, the present invention achieves the function of resetting the memories by the first inverse circuit, the logic circuit, and the second inverse circuits after the computer system is booted. Therefore, the present invention can complete resetting of the memories by using fewer components, thus saving the layout space and reducing the cost of the circuit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory reset apparatus, comprising:
   a first inverse circuit, for receiving a control signal by a north bridge at an input end, inversing the control signal, and generating a first signal at an output end, wherein the control signal controls reset of a plurality of memories;
   a logic circuit, having a first input end, a second input end, and an output end, wherein the first input end the second input end of the logic circuit respectively receive the first signal and an indicating signal, so as to perform a logical operation of the first signal and the indicating signal, and generate a second signal at the output end of the logic circuit, wherein the indicating signal indicates each component of a computer system is completely powered on; and
   a plurality of second inverse circuits, respectively coupled between the logic circuit and the memories, wherein input ends of the second inverse circuits receive the second signal, and inverse the second signal, so as to respectively generate a plurality of reset signals to the memories at output ends of the second inverse circuits, thereby resetting the memories.

2. The memory reset apparatus as claimed in claim 1, wherein the first inverse circuit comprises:
   a first resistor, having a first end coupled to a first voltage and a second end for receiving the control signal;

a second resistor, having a first end coupled to the second end of the first resistor;

a first transistor, having a base end coupled to the second end of the second resistor and an emitter end coupled to a ground end;

a third resistor, having a first end coupled to the first voltage and a second end coupled to an collector end of the first transistor; and a capacitor, having a first end coupled to the first end of the third resistor and a second end coupled to the ground end.

3. The memory reset apparatus as claimed in claim 2, wherein the first transistor is a NPN bipolar transistor.

4. The memory reset apparatus as claimed in claim 1, wherein the logic circuit comprises:

A NAND gate, having a first input end, a second input end, and an output end, wherein the first input end of the NAND gate receives the first signal, the second input end of the NAND gate receives the control signal, and the output end of the NAND gate generates the second signal.

5. The memory reset apparatus as claimed in claim 1, wherein the second inverse circuits each comprise:

a fourth resistor, having first end coupled to output end of the NAND gate; and a second transistor, having a base end coupled to a second end of the fourth resistor, an emitter end coupled to the ground end, and a collector end for generating the reset signal.

6. The memory reset apparatus as claimed in claim 5, wherein the second transistor is a NPN bipolar transistor.

* * * * *